(12) United States Patent
Hishiya (10) Patent No.: US 8,414,242 B2
(45) Date of Patent: Apr. 9, 2013

(54) PROCESSING APPARATUS AND PROCESSING METHOD

(75) Inventor: Katsuyuki Hishiya, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 755 days.

(21) Appl. No.: 12/579,519

(22) Filed: Oct. 15, 2009

(65) Prior Publication Data

US 2010/0098517 A1    Apr. 22, 2010

(30) Foreign Application Priority Data

Oct. 16, 2008    (JP) .................................. 2008-267584

(51) Int. Cl.
*H01L 21/677*    (2006.01)

(52) U.S. Cl.
USPC ............................. 414/217; 414/411; 414/937

(58) Field of Classification Search .................. 414/217, 414/411, 937, 938; 74/20, 89
See application file for complete search history.

(56) References Cited

U.S. PATENT DOCUMENTS

| | | | |
|---|---|---|---|
| 5,562,383 A |  | 10/1996 | Iwai et al. |
| 5,586,585 A | * | 12/1996 | Bonora et al. .................. 141/93 |
| 5,628,683 A | * | 5/1997 | Gentischer .................... 454/187 |
| 5,829,939 A |  | 11/1998 | Iwai et al. |
| 5,895,191 A | * | 4/1999 | Bonora et al. ................. 414/217 |
| 5,931,631 A | * | 8/1999 | Bonora et al. ........... 414/416.01 |
| 6,135,168 A | * | 10/2000 | Yang et al. ........................ 141/98 |
| 6,231,290 B1 |  | 5/2001 | Kikuchi et al. |
| 7,314,068 B2 | * | 1/2008 | Nakano et al. .................... 141/7 |
| 7,568,875 B2 | * | 8/2009 | Le Guet et al. ............... 414/411 |
| 2002/0179892 A1 |  | 12/2002 | Saeki et al. |
| 2005/0175952 A1 |  | 8/2005 | Toba et al. |
| 2008/0008566 A1 |  | 1/2008 | Endo et al. |
| 2008/0036155 A1 |  | 2/2008 | Shimazaki et al. |
| 2008/0056861 A1 |  | 3/2008 | Takahashi et al. |

FOREIGN PATENT DOCUMENTS

| | | |
|---|---|---|
| CN | 1639857 A1 | 7/2005 |
| CN | 1647253 A1 | 7/2005 |
| CN | 1011018559 A1 | 1/2008 |
| CN | 101140893 A1 | 3/2008 |
| JP | 06-302679 A1 | 10/1994 |

(Continued)

OTHER PUBLICATIONS

Japanese Office Action dated May 15, 2012 (with English translation).

*Primary Examiner* — Saul Rodriguez
*Assistant Examiner* — Jonathan Snelting
(74) *Attorney, Agent, or Firm* — Burr & Brown (57) ABSTRACT

A processing apparatus including: a carry-in area into which a container containing substrates to be processed is carried, the container having a flange part on an upper part thereof and an opening in a front surface thereof, with a lid being detachably fixed to the opening; a transfer area whose atmosphere is maintained differently from an atmosphere of the carry-in area; a partition wall separating the carry-in area and transfer area; a through-hole formed in the partition wall; a door configured to open and close the through-hole; and a table on which the container can be placed in the carry-in area. After the container has been placed and then held on the table, the container is brought into contact with the through-hole, the door and the lid are opened, and the substrates to be processed in the container are conveyed to the transfer area so as to process the substrates.

4 Claims, 7 Drawing Sheets

FOREIGN PATENT DOCUMENTS

| | | |
|---|---|---|
| JP | 11-274267 A1 | 10/1999 |
| JP | 2002-353289 A1 | 12/2002 |
| JP | 2004-006804 A1 | 1/2004 |
| JP | 2006-179613 A1 | 7/2006 |
| JP | 2007-055698 A1 | 3/2007 |
| JP | 2008-060513 A1 | 8/2008 |

* cited by examiner

PROCESSING APPARATUS AND PROCESSING METHOD

CROSS REFERENCE TO RELATED APPLICATIONS

This application is based upon and claims the benefit of priority from the prior Japanese Patent Application No. 2008-267584 filed on Oct. 16, 2008, the entire contents of which are incorporated herein by reference.

FIELD OF THE INVENTION

The present invention relates to a processing apparatus and a processing method in which a substrate to be processed is taken out from a container, which has an opening in a front surface thereof with a lid, and the substrate to be processed is subjected to a predetermined process such as a thermal process.

BACKGROUND ART

As one of semiconductor manufacturing apparatuses, there has been known a thermal processing apparatus that performs a thermal process such as a CVD (Chemical Vapor Deposition) process to a number of substrates to be processed such as semiconductor wafers (hereinafter referred to also as "wafer"). The thermal processing apparatus includes a carry-in area into which a container containing a plurality of wafers is carried by an automatic conveying robot or an operator, and a loading area as a transfer area in which the wafers in the container are transferred to a boat as a substrate holder so as to be loaded into and unloaded from a thermal processing furnace.

In such a thermal processing apparatus, in order that an atmosphere of the loading area is made cleaner than that of the carrying-in area and that generation of a natural oxide film on a wafer is prevented, it is preferable that the carrying-in area on the atmospheric side and the loading area are separated from each other by a partition wall, and that the loading area is filled with, e.g., nitrogen ($N_2$) gas so as to provide an inert gas atmosphere. In this case, in order to restrain wafers from being contaminated by particles, there is preferably used a sealable container (FOUP; front port unify pod) having a lid that is detachably attached to an opening formed in a front surface of the container.

Figure 9A:
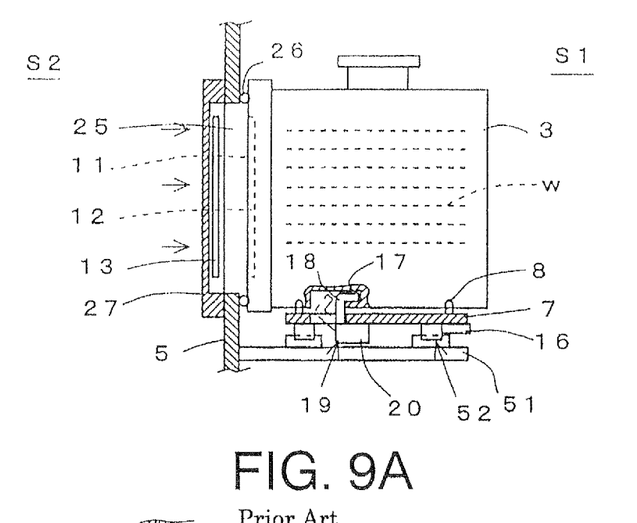

FIG. 9A shows a state in which the sealable container is in contact with the aforementioned partition wall. In FIG. 9A, the reference number 5 depicts the partition wall separating the carry-in area S1 and the loading area S2 from each other, 25 depicts an opening formed in the partition wall 5, and 27 depicts a door that can open and close the through-hole 25. A FOUP 3 is placed on a table (also referred to as "transfer stage") 7 disposed in the carry-in area S1. Then, the FOUP 3 is held by a locking mechanism 19, and thereafter the FOUP 3 is pressed toward the partition wall 5 by a contact drive part such as an air cylinder 16, so that a peripheral portion of an opening 11 of the FOUP 3 is brought into contact with a sealing member 26 arranged on a peripheral portion of the through-hole 25. After that, a lid 12 of the FOUP 3 is opened.

The door 27 is provided with a lid opening/closing mechanism 13 for opening and closing the lid 12. The transfer stage 7 is slidably supported on a stand 51 via a slide guide 52 in a fore and aft direction (i.e., in a right and left direction of the plane of FIG. 9A). A plurality of positioning pins 8 for positioning the FOUP 3 are projectingly disposed on the transfer stage 7. The locking mechanism 19 is arranged on the transfer stage 7, and is adapted to hold the FOUP 3 by engaging an engagement member 18 of the locking mechanism 19 with an engagement recess 17 formed in a bottom part of the FOUP 3.

In order to open the lid 12, the lid 12 is opened by the lid opening/closing mechanism 13, with the door 27 being closed. In this case, it is preferable that, after an atmosphere in the FOUP 3 has been replaced with nitrogen gas by a nitrogen-gas replacing means, not shown, the door 27 and the lid 12 are retracted from the through-hole 25, and than wafers W in the FOUP 3 are loaded into the loading area S2. This is because increase in a concentration of oxygen in the loading area can be restrained. Such a technique is described in JP11-274267A.

Figure 9B:
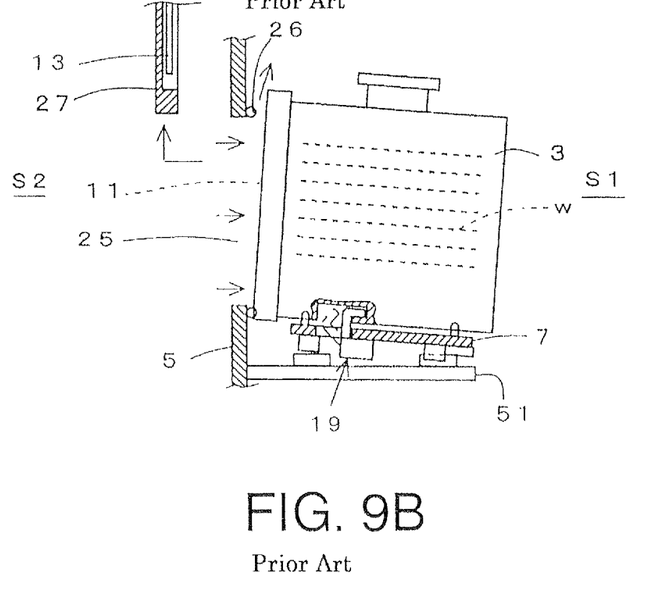

When the lid 12 of the FOUP 3 is opened, the FOUP 3 is subjected to a differential pressure between an internal pressure of the loading area S2 and an atmospheric pressure of the carry-in area S1. However, the above-described thermal processing apparatus is not so resistive to such a differential pressure. Thus, as shown in FIG. 9B, there is a possibility that the FOUP 3 is swayed by the differential pressure, and/or that the FOUP 3 is inclined and displaced from the through-hole 25 of the partition wall 5, which invites the following problems.

Namely, because of the displacement of the FOUP 3, there may occur mapping error of waters W and transfer mistake of the wafers W. In addition, the concentration of oxygen in the loading area S2 may be increased by leakage of the nitrogen gas. In this case, since the atmosphere of the loading area has to be again replaced with nitrogen gas, TAT (Turn Around Time) may be adversely affected. Further, there is a possibility that a moisture, an organic component, etc., will flow into the loading area S2.

This problem has been solved by JP 2004-6804A of the Applicant of this patent application. However, in JP 2004-6804A, since the container is pressed from above onto the table, it is difficult to apply the technique to a processing apparatus in which a sufficient room is difficult to be obtained above a container.

The present invention provides a processing apparatus and a processing method that solve the problems of the aforementioned conventional technique, and restrain a displacement of a container from an opening of a partition wall, while improving a resistance to a differential pressure between a pressure of a transfer area and a pressure of a carry-in area.

SUMMARY OF THE INVENTION

The present invention is a processing apparatus comprising: a housing including: a carry-in area into which a container containing a plurality of objects to be processed is carried, the container having a flange part on an upper part thereof and an opening in a front surface thereof, with a lid being detachably fixed to the opening; and a transfer area whose atmosphere is maintained differently from an atmosphere of the carry-in area; a partition wall disposed in the housing, the partition wall separating the carry-in area and the transfer area from each other and having a through-hole formed therein; a door disposed on the partition wall, the door being configured to open and close the through-hole of the partition wall; a table disposed in the carry-in area, on which the container can be placed; and a pressing mechanism disposed in the carry-in area, the pressing mechanism being configured to press the flange part of the container, which is in contact with the partition wall around the through-hole, onto the through-hole of the partition wall; wherein, after the container has been placed and then held on the table, the container is brought into contact with the partition wall around the through-hole, the flange part of the container in contact with the partition wall around the through-hole is pressed onto the through-hole by the pressing mechanism, the door and the lid are opened, and the objects to be processed in the container are conveyed from the carry-in area to the transfer area so as to process the objects to be processed.

In the present invention, the pressing mechanism includes: a pressing arm configured to be horizontally turned from a waiting position on one side of the carry-in area toward a rear part of the flange part so as to press the flange part; and a drive part joined to the pressing arm, the drive part being configured to drive to turn the pressing arm.

In the present invention, the pressing arm includes: a pressing arm whose proximal end is pivotally supported on a waiting position on one side of the carry-in area through a support shaft, such that the pressing arm can be horizontally turned from the waiting position toward a rear part of the flange part so as to press the flange part; and a drive cylinder joined to the pressing arm, the drive cylinder being configured to drive to turn the pressing arm about the support shaft.

In the present invention, the pressing arm includes: a pressing arm disposed on a waiting position on one side of the carry-in area through a support shaft, such that the pressing arm can be horizontally turned so as to press a rear part of the flange part; a drive cylinder joined to the pressing arm and disposed on the waiting position in an up and down direction so as to drive the pressing arm; and a link extending between an output part of the drive cylinder and a substantially intermediate portion of the pressing arm in a longitudinal direction thereof, the link being configured to convert a force of the output part in the up and down direction to a force in a turning direction of the pressing arm.

In the present invention, the atmosphere of the carry-in area is an atmospheric air, and the atmosphere of the transfer area is an inert gas or a clean dry air.

The present invention is a processing method performed with the use of a processing apparatus comprising: a housing including: a carry-in area into which a container containing a plurality of objects to be processed is carried, the container having a flange part on an upper part thereof and an opening in a front surface thereof, with a lid being detachably fixed to the opening; and a transfer area whose atmosphere is maintained differently from an atmosphere of the carry-in area; a partition wall disposed in the housing, the partition wall separating the carry-in area and the transfer area from each other and having a through-hole formed therein; a door disposed on the partition wall, the door being configured to open and close the through-hole of the partition wall; and a table disposed in the carry-in area, on which the container can be placed; the processing method comprising: placing the container on the table and then holding the container; bringing the container into contact with the partition wall around the through-hole; and opening the door and the lid and transferring the objects to be processed in the container from the carry-in area to the transfer area so as to process the objects to be processed; wherein, after the flange part of the container, which is in contact with the partition wall around the through-hole, has been pressed onto the through-hole by the pressing mechanism, the door and the lid are opened.

In the present invention, the pressing mechanism includes: a pressing arm configured to be horizontally turned from a waiting position on one side of the carry-in area toward a rear part of the flange part so as to press the flange part; and a drive part joined to the pressing arm, the drive part being configured to drive to turn the pressing arm.

In the present invention, the pressing arm includes: a pressing arm whose proximal end is pivotally supported on a waiting position on one side of the carry-in area through a support shaft, such that the pressing arm can be horizontally turned from the waiting position toward a rear part of the flange part so as to press the flange part; and a drive cylinder joined to the pressing arm, the drive cylinder being configured to drive to turn the pressing arm about the support shaft.

In the present invention, the pressing arm includes: a pressing arm disposed on a waiting position on one side of the carry-in area through a support shaft, such that the pressing arm can be horizontally turned so as to press a rear part of the flange part; a drive cylinder joined to the pressing arm and disposed on the waiting position in an up and down direction so as to drive the pressing arm; and a link extending between an output part of the drive cylinder and a substantially intermediate portion of the pressing arm in a longitudinal direction thereof, the link being configured to convert a force of the output part in the up and down direction to a force in a turning direction of the pressing arm.

In the present invention, the atmosphere of the carry-in area is an atmospheric air, and the atmosphere of the transfer area is an inert gas or a clean dry air.

According to the present invention, the resistance to the differential pressure between the pressure of the transfer area and the carry-in area can be improved, whereby the displacement of the container from the through-hole of the partition wall can be restrained.

DESCRIPTION OF THE DRAWINGS

FIGS. 4A and 4B are view showing a part A of FIG. 1, in which

FIGS. 5A to 5C are views showing a pressing mechanism, in which

FIGS. 9A and 9B are views for explaining a problem of the conventional technique, in which FIG. 8A is a side view thereof before a door of a partition wall is opened and FIG. 9B is a side view thereof after the door of the partition wall has been opened.

DETAILED DESCRIPTION OF THE INVENTION

Embodiments of the present invention will be described in detail below with reference to the drawings.

Figure 1:
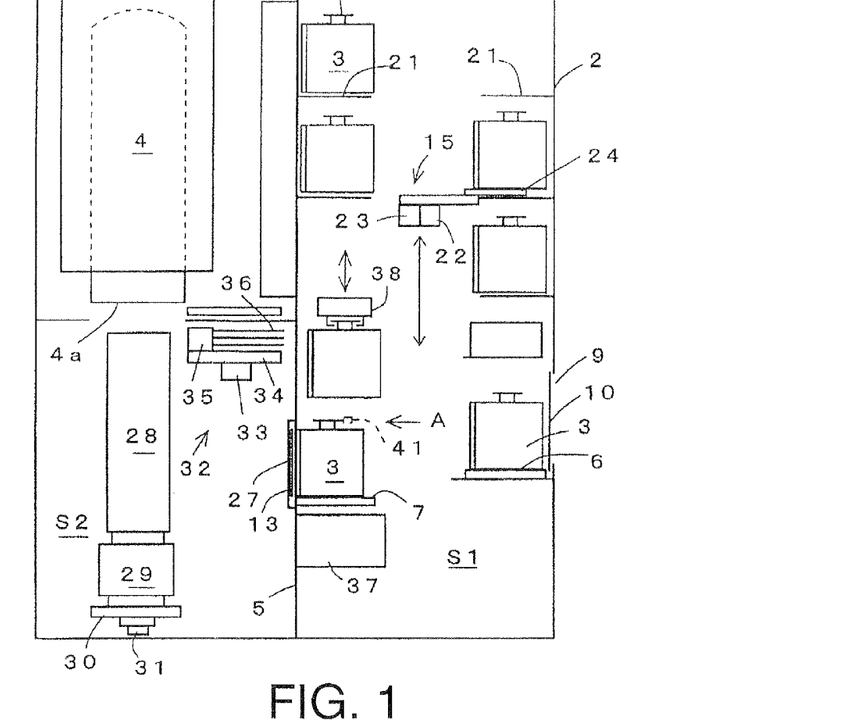
FIG. 1 is a longitudinal sectional view schematically showing a vertical thermal processing apparatus in one embodiment of a processing apparatus of the present invention.
Figure 2:
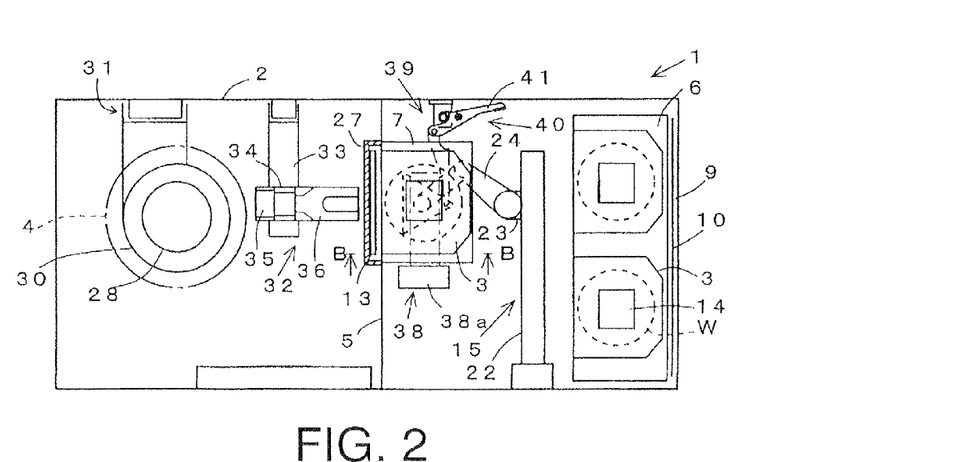
FIG. 2 is a transversal plan view schematically showing the vertical thermal processing apparatus.

FIG. 1 is a longitudinal sectional view schematically showing a vertical thermal processing apparatus in one embodiment of a processing apparatus of the present invention. FIG. 2 is a transversal plan view schematically showing the vertical thermal processing apparatus.

As shown in FIGS. 1 and 2, the vertical thermal processing apparatus (hereinafter referred to also as "thermal processing apparatus") 1 includes a housing 2 defining an outer profile. In the housing 2, there are formed a carry-in area S1 and a loading area S2. In the carry-in area S1, a FOUP 3 containing wafers W as an object to be processed is carried into and carried out from the thermal processing apparatus 1. In the loading area S2 serving as a conveyance area, the wafers W in the FOUP 3 are conveyed and loaded into a thermal processing furnace 4 which will be described below. The carry-in area S1 and the loading area S2 are separated from each other by a partition wall 5. The carry-in area S1 is in an atmospheric atmosphere, and the loading area S2 is in an inert gas atmosphere such as a nitrogen ($N_2$) gas atmosphere. However, the loading area S2 may be in a clean dry air atmosphere (in which air contains less particles and organic components and has a dew point of 60° C. or less).

On a front side of the thermal processing apparatus in the carry-in area S1, there is disposed a first table (load port) 6 on which two FOUPs 3 can be placed in the right and left direction. On a rear side of the carry-in area S1, there is disposed a second table (transfer stage) 7 on which one FOUP 3 can be placed. On surfaces of the first table 6 and the second table 7 on which the FOUPs 3 can be placed, there are projectingly disposed pins 8 (see, FIG. 3) configured to be fitted in recesses (illustration omitted) formed in a bottom part of each FOUP 3 so as to hold (three-point support) the FOUP 3 in position. A front surface of the housing 2 has an opening 9 through which the FOUP 3 can be carried into and carried out from the housing 2 so as to be put on and taken out from the load port 6. A door 10 capable of being elevated and lowered is provided on the opening 9.

The FOUP 3 can contain a plurality of, e.g., twenty five 300-mm wafers W that are arranged in a tier-like manner. A lid 12 is detachably fixed to an opening 11 that is formed in a front surface of the FOUP 3. The lid 12 has a latch mechanism, not shown, for holding the lid 12 to the opening 11 of the FOUP 3. By releasing the latch mechanism by means of the below-described lid opening/closing mechanism 13, the lid 12 can be detached from the opening 11. The lid 12 is equipped with a key hole, and a key of the lid opening/closing mechanism 13 is inserted into the key hole, so that the latch mechanism can be released (illustration omitted). As the lid opening/closing mechanism 13, there can be used a lid attaching/detaching mechanism described in, for example, JP2002-353289A can be employed. Further, a flange 14 having a rectangular cross-section is disposed on an upper surface of the FOUP 3 with a gap therebetween. The flange part 14 can be gripped by an automatic conveying robot.

The transfer stage 7 is configured to be movable in the fore and aft direction by means of a drive part 16 (see, FIG. 3), e.g., an air cylinder, between a position at which the FOUP 3 is placed by the below-described FOUP conveying mechanism 15, and a position at which the FOUP 3 is in contact with the partition wall 5.

In addition, the transfer stage 7 has a locking mechanism 19 for holding the FOUP 3, the locking mechanism 19 having a hook-shaped engagement member 18 which can be engaged with an engagement recess 17 formed in the bottom part of the FOUP 3. The locking mechanism 19 is configured such that the engagement member 18 can be rotated about a horizontal axis by a drive part 20, whereby the engagement member 18 can be rotated between a position at which the engagement member 18 is engaged with the engagement recess 17 and a position at which the engagement therebetween is released.

On the other hand, above the load port 6 and the transfer stage 7 in the carry-in area S1, there are disposed a plurality of storage shelf parts 21 that can temporarily store the plurality of FOUPs 3. The FOUP conveying mechanism 15 is provided in the carry-in area S1. The FOUP conveying mechanism 15 conveys the FOUR 3 among the load port 6, the transfer stage 7, and the storage shelf parts 21. The FOUP conveying mechanism 15 includes: a guide part 22 extending in the right and left direction, which can be elevated and lowered; a moving part 23 configured to move along the guide part 22 in the right and left direction; and an articulated arm 24 disposed on the moving part 23, the articulated arm 24 being configured to horizontally convey the FOUP 3 while holding the bottom part of the FOUP 3.

The partition wall 5 has the through-hole 25 that communicates the inside of the FOUP 3 and the loading area S2, when the FOUP 3 placed on the transfer stage 7 is brought into contact with the partition wall 5. On a peripheral portion of the through-hole 25 on the side of the carry-in area S1, there is disposed a sealing member 26 for hermetically sealing a gap between a peripheral portion of the opening 11 of the FOUP 3, which is in contact with the through-hole 25, and the peripheral portion of the through-hole 25. A door 27 for opening and closing the through-hole 25 is provided on the partition, wall 5 an the side of the loading area S2. The door 27 is equipped with the lid opening/closing mechanism 13 which can open and close the lid 12 of the FOUP 3 while the door 27 is closed. After the lid 12 of the FOUP 3 has been opened, the door 27 is configured to be retracted, together with the lid opening/closing mechanism 13 and the lid 12, by a not-shown lid opening/closing mechanism, to an upper position so as not to interfere with the transfer of the wafers W.

In order to replace an air inside the FOUP 3 with nitrogen gas, a nitrogen-gas supply orifice is formed in one of right and left opposed edges of the through-hole 25 of the partition wall 5, and an exhaust orifice is formed in the other edge (illustration omitted).

Disposed in an upper part of the loading area S2 is the vertical thermal processing furnace 4 having a lower end thereof being opened as a furnace opening 4a. Below the thermal processing furnace 4, a boat 28, which serves as a holder for holding a number of, e.g., one hundred wafers W in a tier-like manner, is placed on a lid member 30 via a heat insulation part 29. The lid member 30 is supported by an elevating and lowering mechanism 31. The boat 28 can be carried into and carried out from the thermal processing furnace 4 by the elevating and lowering mechanism 31, and the furnace opening 4a of the thermal processing apparatus 4 can be opened and closed by the lid member 30.

Between the boat 28 in the loading area S2 and the through-hole 25 of the partition wall 5, there is disposed a transfer mechanism 32 that transfers wafers W between the FOUP 3, which is in contact with partition wall 5 around the through-hole 25, and the boat 28. The transfer mechanism 32 includes: a guide part 33 extending in the right and left direction, which can be elevated and lowered; a rectangular parallelepiped seat 34 capable of moving along the guide part 33 in the right and left direction and of rotating about a vertical axis; a moving member 35 capable of reciprocating along a longitudinal direction of the seat 34; and a plurality of, e.g., five forks 36 provided on the moving member 35. A wafer W can be supported on each of the forks 36.

In FIG. 1, the reference number 37 depicts an aligner that aligns cutouts (e.g., notches) formed in outer circumferences of wafers W In the same direction. The aligner 37 is disposed to face the loading area S2 through an opening formed in the partition wall 5, and the wafers are transferred from the FOUP 3 to the boat 28 by the transfer mechanism 32 via the aligner 37.

Disposed in the carry-in area S1 is a FOUP catcher (transport mechanism) 38 that transports the FOUP 3 from the FOUP conveying mechanism 15 to the transfer stage 7. The FOUP catcher 38 is mainly composed of an elevating and lowering arm 38b disposed on one side (on the left side when viewed from the front in the illustration) of the carry-in area S1, the elevating and lowering arm 38b being configured to be elevated and lowered by an elevating and lowering mechanism 38a; and a gripping mechanism 38c disposed on the elevating and lowering arm 38b, the gripping mechanism 38c being configured to grip the flange part of the FOUP 3. During when the FOUP conveying mechanism 15 conveys the FOUP 3 from the transfer stage 7 to the storage shelf parts 21 or the load port 6, the FOUP catcher 38, which has received the FOUP 3 from, e.g., the FOUP conveying mechanism 15 and waited, places the next FOUP 3 on the transfer stage 7, in order to expedite the conveying operation.

Figure 4A:
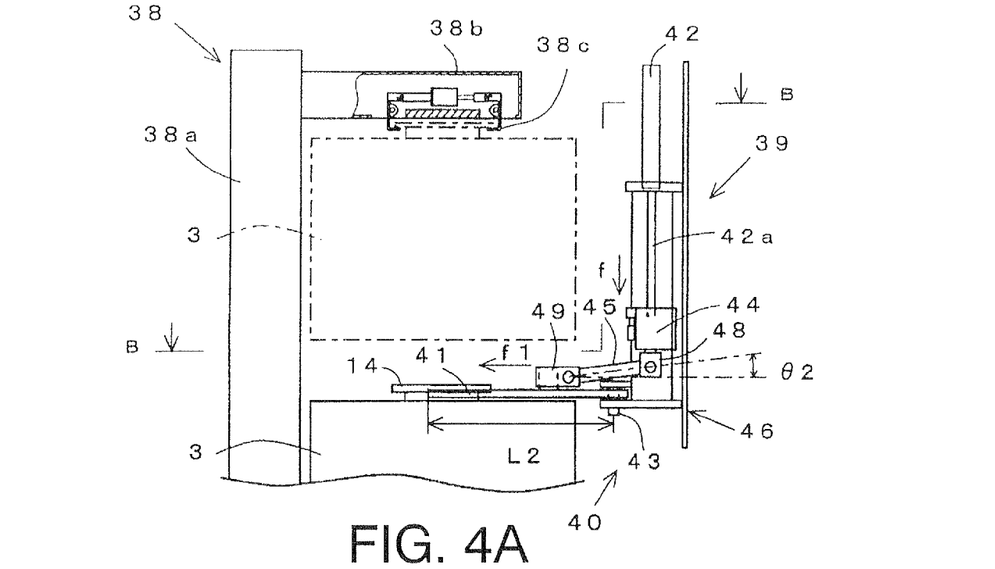
FIG. 4A is a front view thereof and FIG. 4B is a plan view taken along the line B-B in FIG. 4A.

In the thermal processing apparatus 1, there is disposed a pressing mechanism 39 that presses the flange part 14 of the FOUP 3 that is in contact with the through-hole 25 of the partition wall 5 onto the through-hole 25 (i.e., onto the partition wall 5), in order that a resistance to a differential pressure between the pressure of the loading area S2 and the pressure of the carry-in area S1 is improved, so as to restrain a displacement of the FOUP 3 from the through-hole 25 of the partition wall 5. In this case, it is preferable that the pressing mechanism 39 is disposed on one side of the carry-in area S1 (on the right side when viewed from the front in the illustration), in order that the pressing mechanism 39 does not interfere with the FOUP 3 (shown by the imaginary lines) conveyed by the FOUP conveying mechanism 15 and the FOUP catcher 38 as shown in FIG. 4A, and that the pressing mechanism 39 does not interfere with the FOUP 3 (shown by the imaginary lines) conveyed by the FOUP conveying mechanism 15.

As shown in FIGS. 4A, 4B and 5A to 5C, the pressing mechanism 39 is mainly composed of a pressing arm 41 configured to be horizontally turned from a waiting position 40 on the one side the of the carry-in area S1 toward a rear part of the flange part 14 so as to press the flange part 14, and a drive part 42 configured to drive to turn the pressing arm 41. In this embodiment, in order to obtain a large pressing force In a narrow space, the pressing mechanism 39 includes: the pressing arm 41 disposed on the waiting position 40 on the one side of the of the carry-in area through a support shaft 43, such that the pressing arm 41 can be horizontally turned so as to press the rear part of the flange 14; the drive cylinder (drive part) 42 disposed on the waiting position 40 in the up and down direction so as to drive the pressing arm 41, and a link 45 extending between an output part 44 of the drive cylinder 42 and an intermediate portion of the pressing arm 41 in a longitudinal direction thereof, the link 45 being configured to convert a force of the output part 44 in the up and down direction to a force in a turning direction of the pressing arm 41.

The pressing mechanism 39 has a bracket 46 to be fixed on one side wall in the housing 2. The pressing arm 41 is fixed to the bracket 46 through the support shaft 43 such that the pressing arm 41 can be horizontally turned. Further, the drive cylinder (e.g., air cylinder) 42 is fixed to the bracket 46. The drive cylinder 42 is vertically arranged with a piston rod 42a facing downward. In this case, in order to effectively impart a force of the drive cylinder 42 to the pressing arm 41 through the link 45, the support shaft 43 and the drive cylinder 42 are preferably offset from each other in the fore and aft direction of the carry-in area.

The elevating and lowering block (output part) 44 is joined to a distal end of the piston rod 42a of the drive cylinder 42. The elevating and lowering block 44 is slidably supported by a vertical guide 47 fixed to the bracket 46. A first support member 48, which is capable of being vertically rotated, is disposed on a lower part of the elevating and lowering block 44. One end of the link 45 is supported by the first support member 48 so as to be rotatable about the horizontal axis.

The end that is distal to the substantially Intermediate portion of the pressing arm 41 in the longitudinal direction is offset with respect to the support shaft 43, and a second support member 49, which is rotatable In the vertical axis, is disposed on the substantially intermediate portion of the pressing arm 41 in the longitudinal direction. Further, the other end of the link 45 is supported on the second support member 49 so as to be rotatable about the horizontal axis.

Figure 4B:
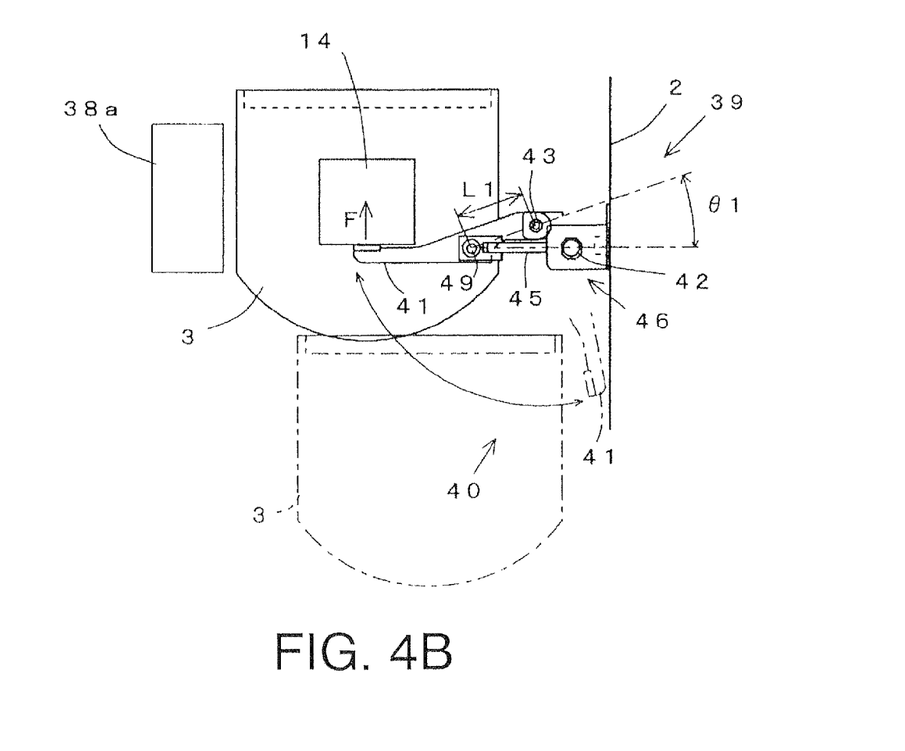
Figure 5A:
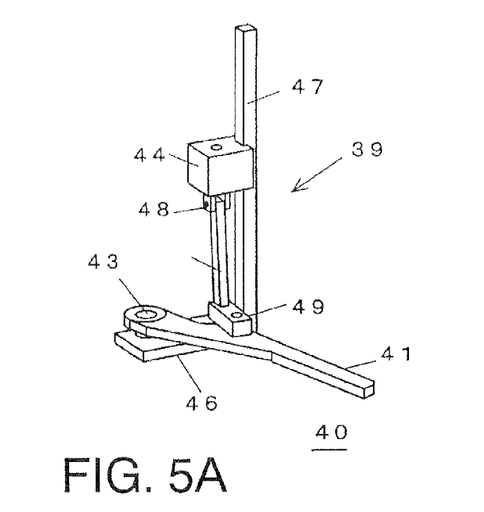
FIG. 5A is a perspective view thereof before operation.
Figure 5B:
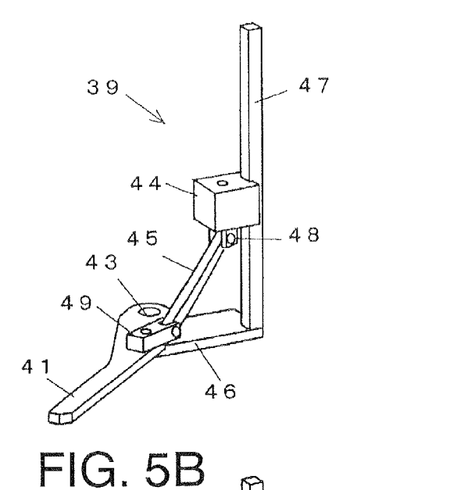
FIG. 5B is a perspective view thereof in the course of operating.
Figure 5C:
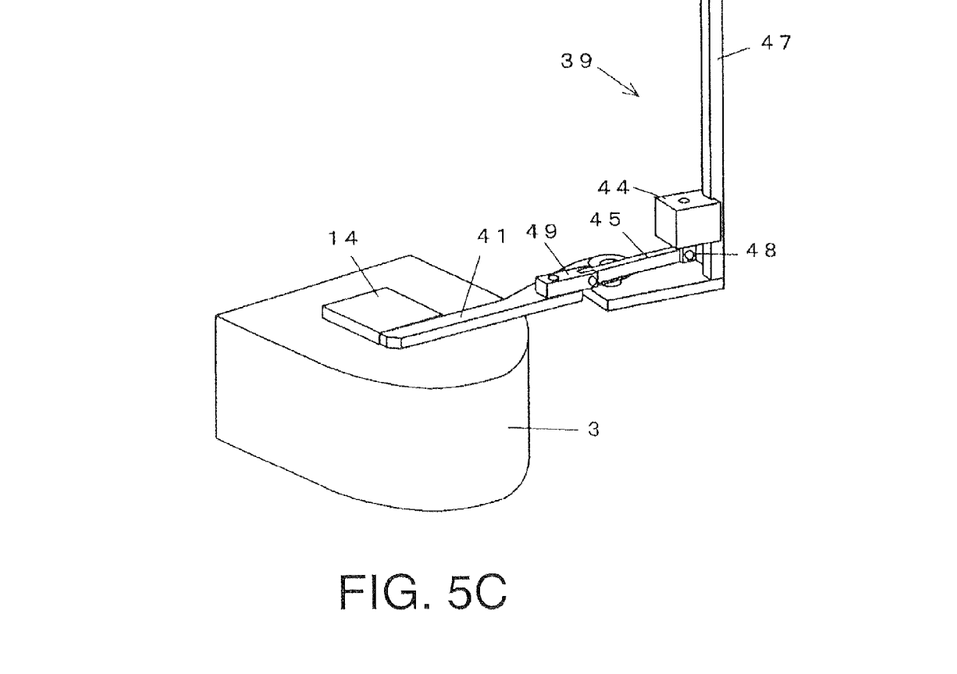
FIG. 5C is a perspective view thereof in the operating state.

In FIGS. 4A and 4B, supposing that an inclination angle of the link 45 with respect to a horizontal surface is $\theta 2$, and that a force applied to the one end of the link 45 from the drive cylinder is f, a horizontal force f1 acting on the second support member 49 is $f1=f/\tan(\theta 2)$. Similarly, supposing that an angle defined by a line connecting the vertical axis of the second support member 49 and the support shaft 43 and the link 45 is $\theta 1$, that a length of the pressing arm 41 from the vertical axis of the second support member 49 to the support shaft 43 is L1, that a length from the support shaft 43 to the distal end of the pressing arm 41 is L2, and that a force (pressing force) acting on the distal end of the pressing arm 41 is F, there is obtained an expression $f1 \cdot \sin(\theta 1) \cdot L1 = F \cdot L2$, namely, $F=f(L1 \cdot \sin \theta/\tan(\theta 2))/L2$. In the experiment, a pressing force F (196N) substantially the same of the force f of the drive cylinder 42 (195N) was obtained. Thus, a resistance to the differential pressure could be improved from 400 Pa to 1000 Pa, whereby the displacement of the FOUP 3 at the maximum differential pressure could be reduced from 1 mm to 0.5 mm.

Figure 3:
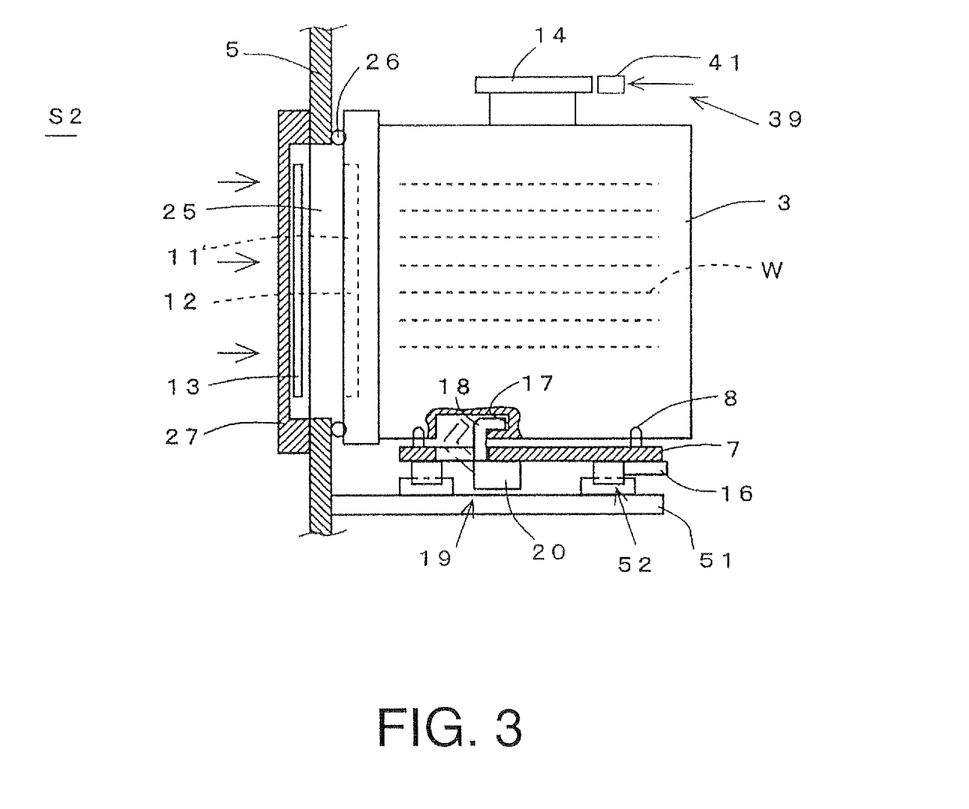
FIG. 3 is a schematic sectional view taken along the line B-B in FIG. 2.

Next, an operation of the aforementioned embodiment is described. At first, the FOUP 3 is placed on the load port 6 by the automatic conveying robot or an operator. Following thereto, the FOUP 3 is conveyed to the transfer stage 7 by the FOUP conveying mechanism 15. After the FOUP 3 has been placed on the transfer stage 7, the engagement member 18 shown in FIG. 3 is firstly rotated so as to be engaged with the engagement recess 17 in the bottom part of the FOUP 3. Then, the transfer stage 7 is moved toward the partition wall 5, so that the peripheral portion of the opening 11 of the FOUP 3 is brought into contact with the sealing member 26 on the peripheral portion of the through-hole 25 of the partition wall 5.

Then, one end of the link 45 is pressed downward from the upwardly inclined state to the horizontal state by the drive cylinder 42 of the pressing mechanism 39 via the elevating and lowering block 44. At this time, due to a horizontal force generating on the other end of the link 45, the pressing arm 41 is horizontally rotated from the waiting position 40 about the support shaft 43 as a supporting point. Thus, the distal end of the pressing arm 41 is brought into contact with the rear part of the flange part 14 of the FOUP 3 placed on the transfer stage 7, so as to press forward the flange part 14 (toward the partition wall 5). Since not only the lower part of the FOUP 3 but also the upper part thereof can be pressed onto the partition wall, a resistance to the differential pressure between the pressure of the loading area and the pressure of the carry-in area can be improved from 400 Pa to 1000 Pa, for example, whereby the displacement of the FOUP 3 at the maximum differential pressure can be reduced from 1 mm to 0.5 mm.

Thereafter, the not-shown key of the lid opening/closing mechanism 13 is Inserted into the key hole of the lid 12 of the FOUP 3, so that the lid 12 is detached from the FOUP 3. Then, the door 27, the lid opening/closing mechanism 13, and the lid 12 are increased, for example, and retracted from the opening 25, so that the inside of the FOUP 3 and the loading area S2 communicate with each other.

Then, the wafers W in the FOUP 3 are sequentially taken out by the transfer mechanism 32 and are transferred to the boat 28. When there remains no wafer W in the FOUP 3, the lid 12 of the FOUP 3 is closed in the reverse manner as described above. Following thereto, the transfer stage 7 is retracted so that the FOUP 3 is separated from the partition wall 5. The FOUP 3 is then conveyed by the FOUP conveying mechanism 15 to the storage shelf part 21 and Is temporarily stored there.

On the other hand, after a predetermined number of wafers W have been placed on the boat 28, the boat 28 is carried into the thermal processing furnace 4, and the wafers W are subjected to a thermal process such as a CVD process, an annealing process, and an oxidation process. Upon completion of the thermal process, the wafers W are returned into the FOUP 3 in the reverse manner as described above. The timing at which the pressing mechanism 39 releases the pressing operation, i.e., the timing at which the pressing arm 41 is returned to the waiting position in this embodiment, is a timing after the through-hole 11 of the FOUP 3 has been closed by the lid 12, for example.

According to the aforementioned embodiment, there is no possibility that the FOUP 3 on the transfer stage 7 is swayed by the differential pressure between the pressure of the loading area S2 and the carry-in area S1 and inclined with respect to the partition wall. Thus, the resistance to the differential pressure can be improved, whereby a stable posture of the FOUP 3 can be maintained. Since the sealing condition between the FOUP 3 and the partition wall 5 is not violated, flowing of an atmosphere from the carry-in area S1 on the atmospheric side into the loading area S2 can be prevented, to thereby restrain increase in the concentration of oxygen in the loading area S2. In addition, since jumping out of the wafers W can be prevented, the succeeding taking-out operation of the wafers W by the transfer mechanism 32 and the mapping operation of the wafers W can be performed without trouble.

When the atmosphere in the FOUP 3 is replaced with an inert gas, even when a flow rate of the inert gas is increased, the FOUP 3 will not be swayed. Thus, the flow rate of the inert gas can be increased, which results in reduction of time required for the replacement of the inert gas to thereby enhance a throughput. Further, even when the FOUP 3 experiences a large impact when the lid 12 is opened and closed, since the FOUP 3 is pressed onto the partition wall 5, the posture of the FOUP 3 is stabilized. Furthermore, the pressing mechanism 39 presses the flange part 14, which is provided for automatic conveyance, of the FOUP 3 placed on the transfer stage 7 onto the partition wall 5, such that the flange 14 is pressed onto the partition wall 5 by horizontally turning the pressing arm 41 from the waiting position 40 on the one side. Thus, such a pressing mechanism 39 can be applied to a processing apparatus in which a sufficient space is difficult to be reserved above the FOUP 3 placed on the transfer stage 7 because of a certain obstacle such as the FOUP catcher 38.

Figure 6:
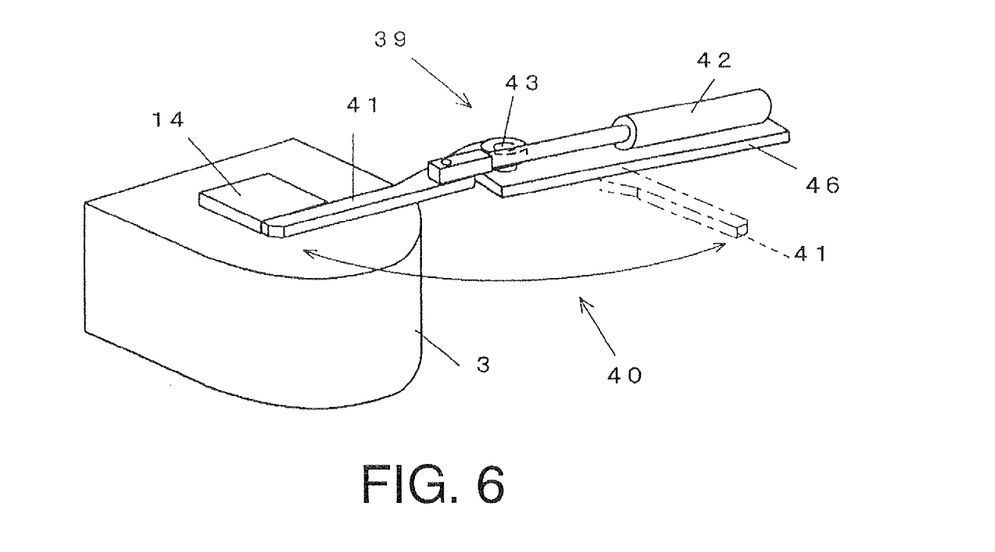
FIG. 6 is a perspective view schematically showing another embodiment of the pressing mechanism.
Figure 7:
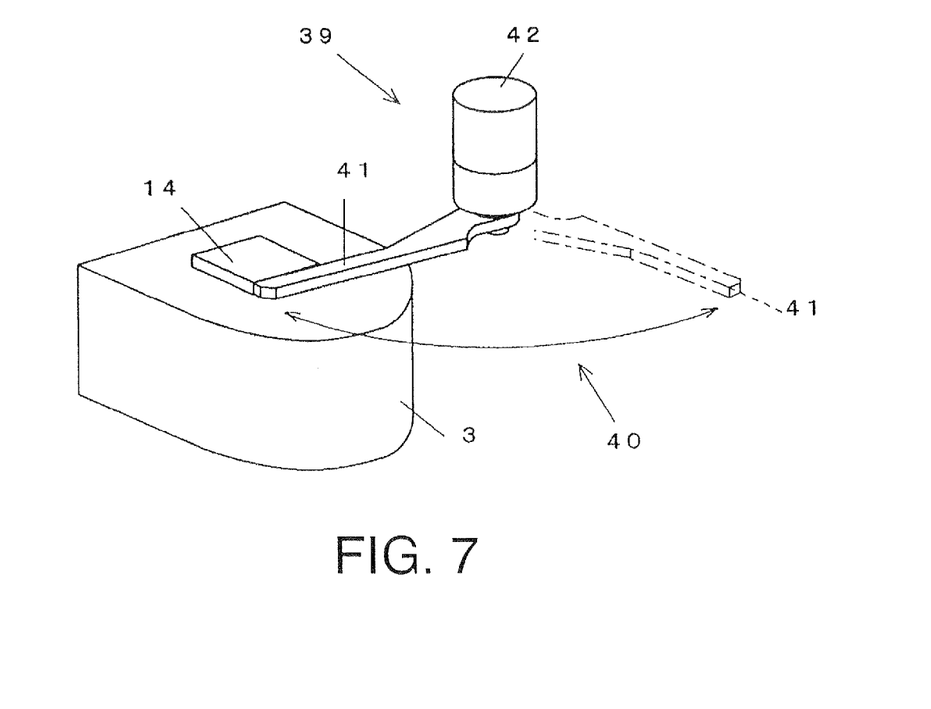
FIG. 7 is a perspective view schematically showing another embodiment of the pressing mechanism.
Figure 8A:
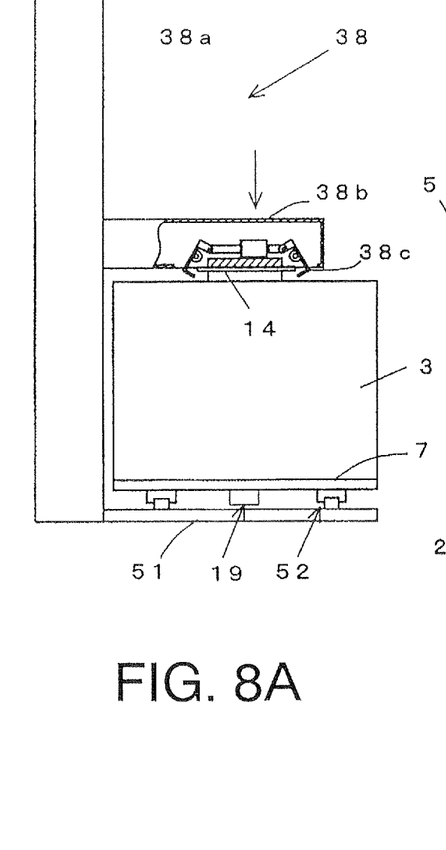
FIGS. 8A and 8B are perspective views schematically showing another embodiment of the pressing mechanism.
Figure 8B:
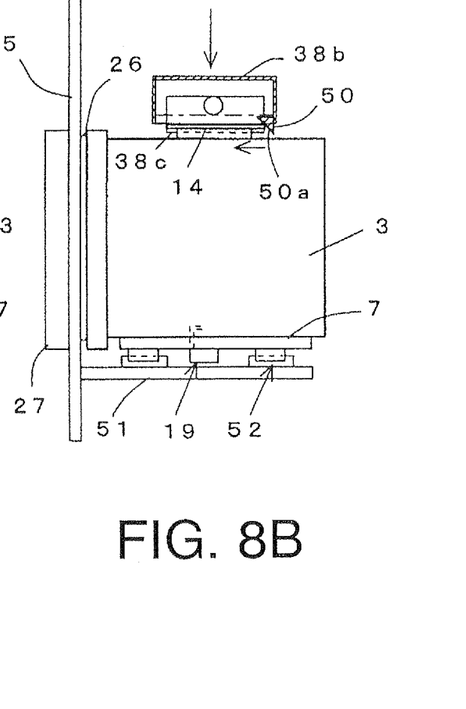

FIGS. 6 to 8 are perspective views schematically showing other embodiments of the pressing mechanism. A pressing mechanism shown in FIG. 6 is mainly composed of: a pressing arm 41 whose proximal end is pivotally supported on a waiting position 40 on one side of the carry-in area S1 through a support shaft 43, such that the pressing arm 41 can be horizontally turned from the waiting position 40 toward the rear part of the flange part 14 so as to press the flange part 14, and a drive cylinder 42 configured to drive to turn the pressing arm 41 about the support shaft. Different from the above embodiment, the drive cylinder 42 is transversely located.

A pressing mechanism shown in FIG. 7 is mainly composed of a pressing arm 41 configured to be horizontally turned from a waiting position 40 on one side of the carry-in area S1 to the rear part of the flange part 14 so as to press the flange part 14, and a drive part (e.g., motor with gears) 42 configured to drive to turn the pressing arm 41.

A pressing mechanism shown in FIGS. 8A and 8B utilizes the FOUP catcher 38. The elevating and lowering arm 38b of the FOUP catcher 38 is equipped with a pressing block 50. The pressing block 50 has an Inclined surface 50a that can be brought into contact with the rear part of the flange part 14 of the FOUP 3 from above so as to convert (decompose) the downward force into a transverse force toward the partition wall 5 and a downward force. According to this embodiment, since the FOUP catcher 38 can be utilized, the structure can be simplified as well as the cost can be decreased.

Although the embodiments of the present invention have been described in detail with reference to the drawings, the present invention is not limited thereto and various design changes are possible without departing from the scope of the present invention. For example, not limited to a vertical thermal processing apparatus, the present invention can be applied to an apparatus for performing a predetermined process to a substrate to be processed, such as a thermal processing apparatus of a single-wafer type, an apparatus for coating and developing a resist, and an ion implanting apparatus. Moreover, the present invention can be applied to an apparatus in which an area into which a FOUP is carried and an area from which the FOUP is carried out are located on separated positions.

The invention claimed is:

1. A processing apparatus comprising:
a housing including: a carry-in area into which a container containing a plurality of objects to be processed is carried, the container having a flange part on an upper part thereof and an opening in a front surface thereof, with a lid being detachably fixed to the opening; and a transfer area whose atmosphere is maintained differently from an atmosphere of the carry-in area;
a partition wall disposed in the housing, the partition wall separating the carry-in area and the transfer area from each other and having a through-hole formed therein;
a door disposed on the partition wall, the door being configured to open and close the through-hole of the partition wall;
a table disposed in the carry-in area, on which the container can be placed; and
a pressing mechanism disposed in the carry-in area, the pressing mechanism being configured to press the flange part of the container, which is in contact with the partition wall around the through-hole, onto the through-hole of the partition wall, and
wherein the pressing mechanism includes:
a pressing arm disposed on a waiting position on one side of the carry-in area through a support shaft, such that the pressing arm can be horizontally turned so as to press a rear part of the flange part;
a drive cylinder joined to the pressing arm and disposed on the waiting position in an up and down direction so as to drive the pressing arm; and
a link extending between an output part of the drive cylinder and a substantially intermediate portion of the pressing arm in a longitudinal direction thereof, the link being configured to convert a force of the output part in the up and down direction to a force in a turning direction of the pressing arm;

wherein, after the container has been placed and then held on the table, the container is brought into contact with the partition wall around the through-hole, the flange part of the container in contact with the partition wall around the through-hole is pressed onto the through-hole by the pressing mechanism, the door and the lid are opened, and the objects to be processed in the container are conveyed from the carry-in area to the transfer area so as to process the objects to be processed.

2. The processing apparatus according to claim 1, wherein the atmosphere of the carry-in area is an atmospheric air, and the atmosphere of the transfer area is an inert gas or a clean dry air.

3. A processing method performed with the use of a processing apparatus comprising: a housing including: a carry-in area into which a container containing a plurality of objects to be processed is carried, the container having a flange part on an upper part thereof and an opening in a front surface thereof, with a lid being detachably fixed to the opening; and a transfer area whose atmosphere is maintained differently from an atmosphere of the carry-in area; a partition wall disposed in the housing, the partition wall separating the carry-in area and the transfer area from each other and having a through-hole formed therein; a door disposed on the partition wall, the door being configured to open and close the through-hole of the partition wall; a table disposed in the carry-in area, on which the container can be placed; and a pressing mechanism disposed in the carry-in area, the pressing mechanism being configured to press the flange part of the container, which is in contact with the partition wall around the through-hole, onto the through-hole of the partition wall;

the processing method comprising:
placing the container on the table and then holding the container;
bringing the container into contact with the partition wall around the through-hole; and
opening the door and the lid and transferring the objects to be processed in the container from the carry-in area to the transfer area so as to process the objects to be processed;
wherein, after the flange part of the container, which is in contact with the partition wall around the through-hole, has been pressed onto the through-hole by the pressing mechanism, the door and the lid are opened, and
wherein the pressing mechanism includes:
a pressing arm disposed on a waiting position on one side of the carry-in area through a support shaft, such that the pressing arm can be horizontally turned so as to press a rear part of the flange part;
a drive cylinder joined to the pressing arm and disposed on the waiting position in an up and down direction so as to drive the pressing arm; and
a link extending between an output part of the drive cylinder and a substantially intermediate portion of the pressing arm in a longitudinal direction thereof, the link being configured to convert a force of the output part in the up and down direction to a force in a turning direction of the pressing arm.

4. The processing method according to claim 3, wherein the atmosphere of the carry-in area is an atmospheric air, and the atmosphere of the transfer area is an inert gas or a dean dry air.

* * * * *